United States Patent [19]

Nakaie et al.

[11] Patent Number: 5,740,007
[45] Date of Patent: Apr. 14, 1998

[54] CDM SIMULATOR

[75] Inventors: Toshiyuki Nakaie; Akira Yoshino; Shin Yoshida; Kenichi Sengo, all of Wakayama, Japan

[73] Assignee: Hanwa Electronic Ind. Co., Ltd., Wakayama, Japan

[21] Appl. No.: 662,433

[22] Filed: Jun. 10, 1996

[51] Int. Cl.$^6$ .................................................. H05F 3/00
[52] U.S. Cl. ................................................ 361/220; 361/222
[58] Field of Search .................................... 361/220, 225, 361/230, 212, 222; 257/691

[56] References Cited

U.S. PATENT DOCUMENTS

| | | | |
|---|---|---|---|
| 5,523,699 | 6/1996 | Miyagawa | 361/225 |
| 5,569,957 | 10/1996 | McLean | 257/691 |

Primary Examiner—Jeffrey A. Gaffin
Assistant Examiner—Stephen Jackson
Attorney, Agent, or Firm—Burgess, Ryan & Wayne

[57] ABSTRACT

A CDM simulator for use with an integrated circuit having a terminal and for use with a grounding conductor, includes a cylindrical conductor, and a mercury lead switch contained in the cylindrical conductor, the mercury lead switch having a first end connected to the cylindrical conductor and a second end for connection to the terminal of the integrated circuit, and the mercury lead switch having a first length, the cylindrical conductor having an end closer to the terminal of the integrated circuit for connection to the grounding conductor in order to release electric charge from the integrated circuit to the grounding conductor, and the cylindrical conductor having a second length longer than the first length of the mercury lead switch.

6 Claims, 3 Drawing Sheets

CDM SIMULATOR

BACKGROUND OF THE INVENTION

This invention relates to a CDM (charged device model) simulator that simulates a rapid discharge of electricity to check for static-electricity-induced or other damage to integrated circuits.

A CDM simulator has a circuit to charge an integrated circuit (IC) 1 connected to a grounding conductor 7 of a direct-current power supply circuit and a discharging circuit including a mercury lead switch 3 connecting a terminal of the IC to a grounding conductor and having a floating inductance and a resistor $R_1$, as shown in FIG. 1. The junction of mercury lead switch 3 and integrated circuit 1 is connected to a terminal 2 of a power source, such as a battery, through a switch S1. Recently, a mercury lead switch is provided in the discharging circuit to prevent the generation of electric arc or other unwanted phenomena, as shown in FIG. 1.

When the mercury lead switch is provided between the grounding conductor and the terminal of the IC that are connected by lead wires, the floating inductance in the discharging circuit becomes very large.

The self-inductance of a straight lead wire having a circular cross-section with a radius a and a length l is expressed as $$L = \mu_0 l/(\log 2l/a - 1)$$

where $\mu_0$ = magnetic permeability in the air $l \ll a$

As is obvious from this, the inductance generated by the mercury lead switch and nearby lead wires is considerably large.

Generally, when $R < 2\sqrt{L/C}$ in a series circuit having a resistor R, capacitor C and inductance L, the discharge current attenuates at a rate of $e^{-\alpha t}$ (where $\alpha = R/2L$) and oscillates with an amplitude of sin $\beta t$ or cos $\beta t$ (where $\beta = \sqrt{1/LC - (R/2L)^2}$).

This means that attenuation takes place rapidly, which in turn means that rapid discharge of electricity does not occur, when inductance L is large.

With the mercury lead switch connected to the grounding conductor and the terminal of the IC by simply using lead wires, in addition, it is difficult to obtain a discharge having a waveform conforming to the requirement specified for the CDM simulator.

The object of this invention is to provide a CDM simulator that reduces the inductance in the discharge circuit by reducing the inductance generated by the lead wires on both sides of the mercury lead switch.

SUMMARY OF THE INVENTION

In a CDM simulator having a mercury lead switch between a grounding conductor and a terminal of an IC to discharge the electric charge from the IC connected to the grounding conductor, the improvement according to this invention is that the mercury lead switch is contained in a cylindrical conductor, the end of the mercury lead switch opposite to the end thereof connected to the terminal of the IC is connected to the cylindrical conductor, and the end of the cylindrical conductor close to the terminal of the IC is connected to the grounding conductor, as shown in FIG. 2.

DETAILED DESCRIPTION OF THE INVENTION

Figure 3:
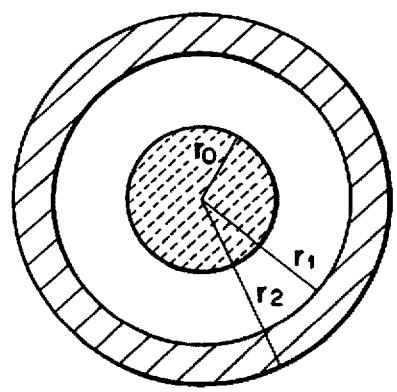
FIG. 3 is a cross-sectional view of a coaxial cylindrical conductor to show the basic principle of this invention.

When cylindrical conductors having a length l and radii $r_0$, $r_1$ and $r_2$ form a reciprocating circuit as shown in FIG. 3, self-inductance can be expressed as $$L = \frac{1}{4\pi} \left[ 2\mu_0 l \log \frac{r_1}{r_0} + \mu \left\{ \frac{2r_2^4}{(r_2^2 - r_1^2)^2} \log \frac{r_2}{r_1} - \frac{r_2^2}{r_2^2 - r_1^2} \right\} \right]$$

where $\mu$ = permeability of the conductor

If $r_0$ is close to $r_1$ and the wall thickness of the outer cylinder and the difference between $r_1$ and $r_2$ are appropriately selected, the inductance L is not very large.

This is due to the fact that the currents passing through the inner lead wire and the surrounding cylinder run in opposite directions. The resulting magnetic fluxes cancel each other, as a result of which the energy $(½)Li^2$ (i is the magnitude of the current passing) produced by the self-inductance L becomes considerably smaller than the one produced when only the inner conductor is used.

The basic principle of this invention takes advantages of the currents passing in opposite directions through the lead wire and the surrounding conductor, with the resulting magnetic fluxes canceling each other.

[Embodiment 1]

Figure 4:
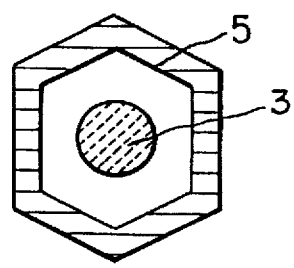
FIG. 4 is a cross-sectional view showing the positional relationship between the mercury lead switch and cylindrical conductor in the first preferred embodiment.

Generally, the conductor 5 surrounding the mercury lead switch 3 and the nearby lead wire are cylindrically shaped. By contrast, the conductor used in Embodiment 1 has a hexagonal cross-section and the mercury lead switch is positioned substantially at the center thereof, as shown in FIG. 4.

This embodiment reduces its self-inductance by canceling the magnetic flux generated by the mercury lead switch and the nearby lead wire by means of the magnetic flux generated by the outer conductor.

[Embodiment 2]

CMD simulators are sometimes equipped with a resistor to increase the attenuation of the discharge current.

In such instances, the resistance wire itself often possesses a certain inductance.

Figure 1:
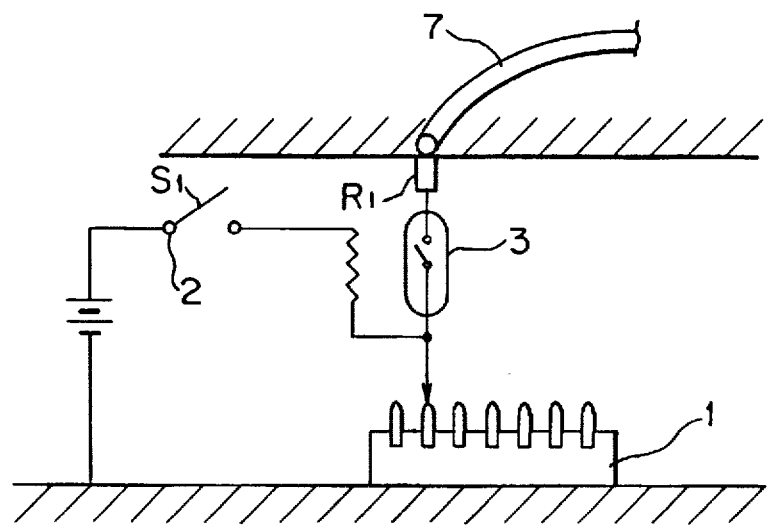
FIG. 1 shows the circuit of a conventional CDM simulator.
Figure 2:
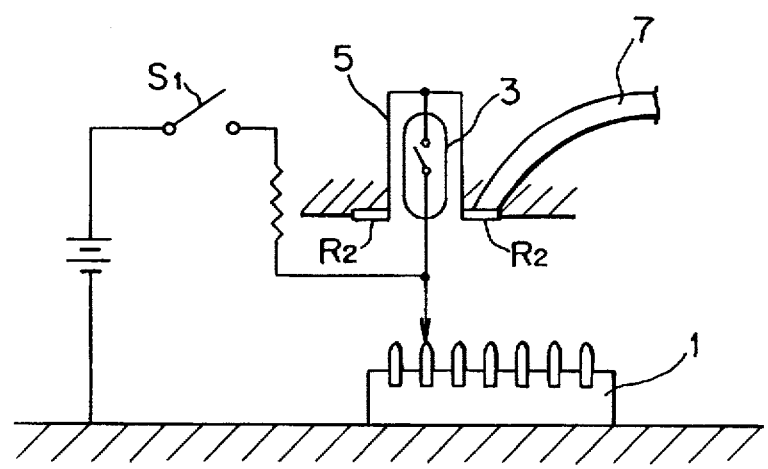
FIG. 2 shows the circuit of a CDM simulator according to this invention.
Figure 5:
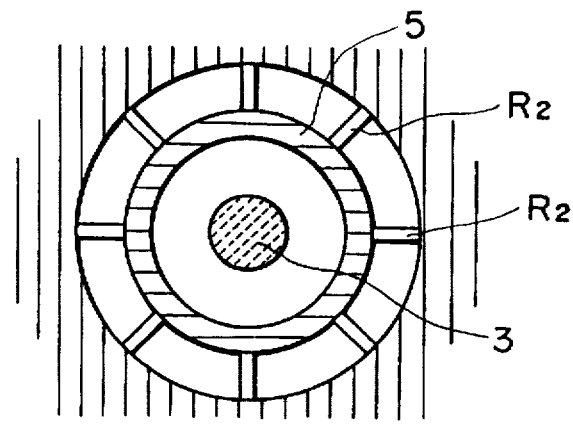
FIG. 5 is a plan view showing the radially disposed resistance wire in the second preferred embodiment.

In Embodiment 2, a resistor $R_2$ is radially connected between a cylindrical conductor 5 and a grounding conductor, as shown in FIGS. 2 and 5.

Then, the magnetic fluxes generated by the resistor $R_2$ cancel each other, thereby reducing the influence of the self-inductance of the resistor $R_2$.

With the self-inductance thus reduced, the CMD simulators of this invention are capable of simulating rapid discharge phenomena by releasing the discharge current at a stroke.

Figure 6A:
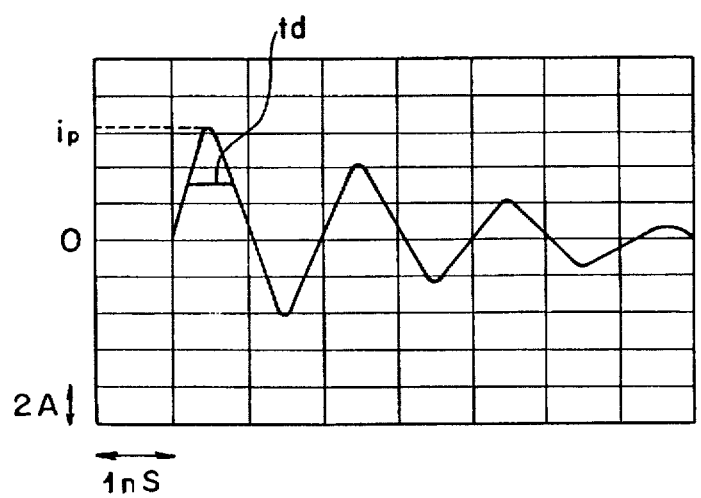
FIGS. 6(a) and (b) show the currents discharged by the conventional CDM simulator and the CDM simulator of this invention.
Figure 6B:
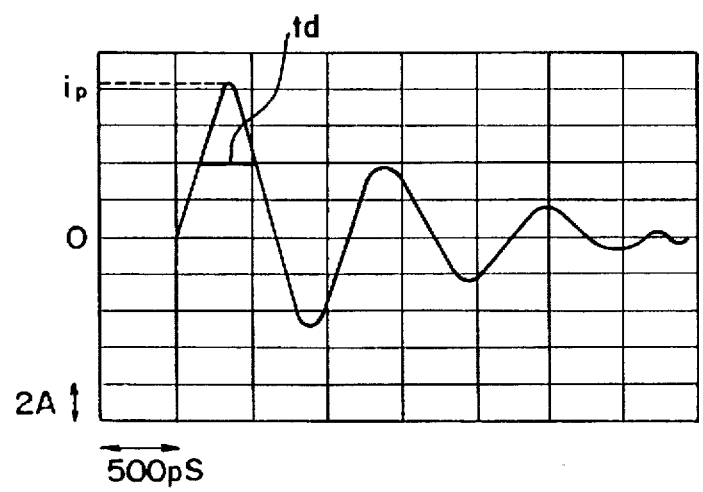

FIG. 6(a) shows the waveform of a discharge current induced by a conventional CMD simulator that applies a voltage of 500 volts to an IC terminal having a capacity of 4 PF through a commonly used mercury lead switch. In this case, the peak current $i_p$ is 6.2 amperes and the full-width at half maximum is 680 Psec. By comparison, FIG. 6(b) shows the waveform of a discharge current induced by a CMD simulator having an outer cylindrical conductor. In this case, the peak current $i_p$ and the full-width at half maximum are 8.4 amperes and 380 Psec. As is obvious from this, the CMD simulators according to this invention produce much greater peak currents and perform much faster current discharge than the conventional ones.

Because of the smaller inductance L, furthermore, the CMD simulators of this invention can freely make any desired waveform by adding appropriate capacitance C.

The improvements described above make the CMD simulators of this invention extremely valuable for use. The junction of mercury lead switch 3 and integrated circuit 1 is connected to a power source, such as a battery, through a switch S1.

What is claimed is:

1. In a CDM simulator having a mercury lead switch provided between a grounding conductor and a terminal of an integrated circuit to release electric charge from the integrated circuit connected to the grounding conductor, the improvement comprising that:

the mercury lead switch is contained in a cylindrical conductor, with one end of the mercury lead switch connected to the cylindrical conductor and an opposite end connected to the terminal of the integrated circuit, an end of the cylindrical conductor closer to the terminal of the integrated circuit is connected to the grounding conductor, and a resistance wire connected to the grounding conductor is radially provided at the end of the cylindrical conductor that is closer to the integrated circuit.

2. In a CDM simulator having a mercury lead switch provided between a grounding conductor and a terminal of an integrated circuit to release electric charge from the integrated circuit connected to the grounding conductor, the improvement comprising that:

the mercury lead switch is contained in a cylindrical conductor, with one end of the mercury lead switch connected to the cylindrical conductor and an opposite end connected to the terminal of the integrated circuit, an end of the cylindrical conductor closer to the terminal of the integrated circuit is connected to the grounding conductor, and the cylindrical conductor has one of a circular and polygonal cross-section and the mercury lead switch is disposed substantially at the center thereof.

3. A CDM simulator for use with an integrated circuit having a terminal and for use with a grounding conductor, said CDM simulator comprising:

a cylindrical conductor, and a mercury lead switch contained in said cylindrical conductor, the mercury lead switch having a first end connected to the cylindrical conductor and a second end for connection to the terminal of the integrated circuit, and the mercury lead switch having a first length, the cylindrical conductor having an end closer to the terminal of the integrated circuit for connection to the grounding conductor in order to release electric charge from the integrated circuit to the grounding conductor, and the cylindrical conductor having a second length longer than the first length of the mercury lead switch.

4. A CDM simulator according to claim 3, further comprising a resistance wire connected to the grounding conductor radially outward of the end of the cylindrical conductor that is closer to the terminal of the integrated circuit.

5. A CDM simulator according to claim 3, wherein the cylindrical conductor has a circular cross-section and the mercury lead switch is positioned substantially centrally therein.

6. A CDM simulator according to claim 3, wherein the cylindrical conductor has a polygonal cross-section and the mercury lead switch is positioned substantially centrally therein.

* * * * *